(12) United States Patent
Utsunomiya (10) Patent No.: US 8,013,631 B2
(45) Date of Patent: Sep. 6, 2011

(54) CMOS INPUT BUFFER CIRCUIT

(75) Inventor: Fumiyasu Utsunomiya, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/813,031

(22) Filed: Jun. 10, 2010

(65) Prior Publication Data

US 2011/0001513 A1    Jan. 6, 2011

(30) Foreign Application Priority Data

Jul. 3, 2009    (JP) ................. 2009-159128
Aug. 7, 2009    (JP) ................. 2009-185083
Nov. 20, 2009    (JP) ................. 2009-265455

(51) Int. Cl.
*H03K 19/0175*    (2006.01)
*H03L 5/00*    (2006.01)

(52) U.S. Cl. ........................ 326/81; 327/333

(58) Field of Classification Search .......... 326/62, 326/68, 80, 82, 83, 86, 87, 95, 98, 112, 115, 326/126, 127; 327/291–297, 299, 171, 333
See application file for complete search history.

(56) References Cited

U.S. PATENT DOCUMENTS

| | | | | |
|---|---|---|---|---|
| 4,096,584 A | * | 6/1978 | Owen et al. ............... | 365/227 |
| 4,675,544 A | * | 6/1987 | Schrenk ................... | 326/81 |
| 4,697,101 A | * | 9/1987 | Iwahashi et al. .......... | 326/80 |
| 5,144,167 A | * | 9/1992 | McClintock .............. | 326/71 |
| 5,359,243 A | * | 10/1994 | Norman ................... | 326/65 |
| 6,222,384 B1 | * | 4/2001 | Kim ........................ | 326/68 |
| 6,445,622 B1 | * | 9/2002 | Hirano ..................... | 365/189.11 |
| 6,614,283 B1 | * | 9/2003 | Wright et al. ............. | 327/333 |
| 7,053,656 B2 | * | 5/2006 | Seo ......................... | 326/68 |
| 2006/0192587 A1 | * | 8/2006 | Bhattacharya et al. ...... | 326/80 |
| 2007/0188193 A1 | * | 8/2007 | Narwal et al. ............. | 326/80 |

FOREIGN PATENT DOCUMENTS

JP    2000-013214 A    1/2000

* cited by examiner

*Primary Examiner* — Shawki Ismail
*Assistant Examiner* — Dylan White
(74) *Attorney, Agent, or Firm* — Brinsk Hofer Gilson & Lione (57) ABSTRACT

Provided is a complementary metal oxide semiconductor (CMOS) input buffer circuit that is capable of lower voltage operation with lower current consumption. The CMOS input buffer circuit includes: a depletion type NMOS transistor including a drain connected to a power supply terminal (VDD), and a gate connected to an output terminal; a PMOS transistor including a source connected to a source of the depletion type NMOS transistor, a drain connected to the output terminal, and a gate connected to an input terminal; and an NMOS transistor including a source connected to a reference terminal (GND), a gate connected to the input terminal, and a drain connected to the output terminal.

7 Claims, 5 Drawing Sheets

CMOS INPUT BUFFER CIRCUIT

RELATED APPLICATIONS

This application claims priority under 35 U.S.C. §119 to Japanese Patent Application Nos. 2009-159128 filed on Jul. 3, 2009, 2009-185083 filed on Aug. 7, 2009, and 2009-265455 filed on Nov. 20, 2009, the entire contents of which are hereby incorporated by reference.

BACKGROUND OF THE INVENTION

1. Field of the Invention

The present invention relates to a complementary metal oxide semiconductor (CMOS) input buffer circuit for converting an input signal lower than CMOS level into a CMOS level output signal, and more particularly, to a CMOS input buffer circuit, which is required to operate over a wide power supply voltage range and with lower current consumption.

2. Description of the Related Art

A CMOS input buffer circuit is a CMOS circuit capable of converting a voltage to be input to an input terminal of the CMOS circuit into a CMOS level signal corresponding to a power supply voltage for operating the CMOS circuit and outputting the CMOS level signal by judging whether an input level of the input voltage is High or Low, even if the input voltage has an indefinite level.

Figure 7:
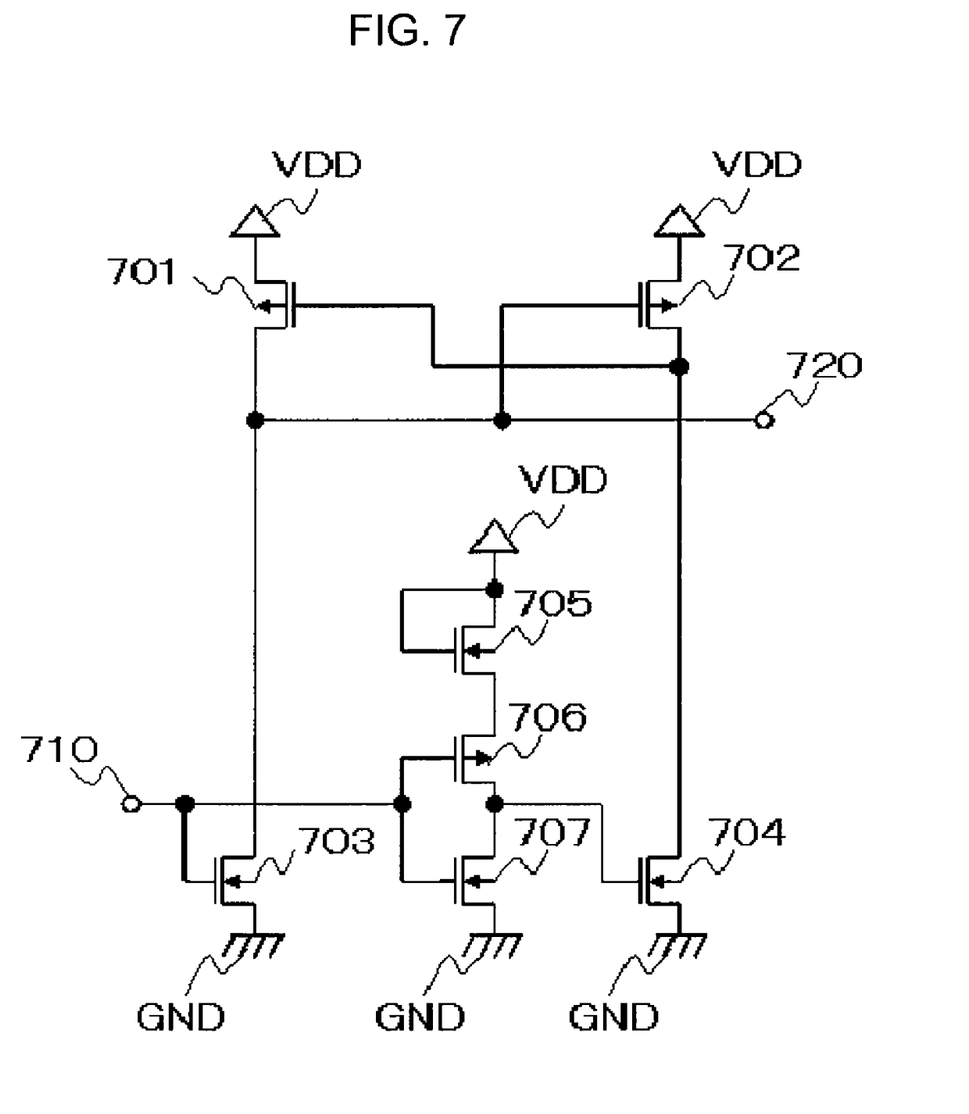
FIG. 7 is a circuit diagram illustrating a conventional CMOS input buffer circuit.

FIG. 7 illustrates a conventional CMOS input buffer circuit. A PMOS transistor 701 has a source connected to a power supply terminal VDD, a drain connected to an output terminal 720, and a gate connected to a drain of a PMOS transistor 702 and a drain of an NMOS transistor 704. The PMOS transistor 702 has a source connected to the power supply terminal VDD, and a gate connected to the output terminal 720. An NMOS transistor 703 has a source connected to a reference terminal GND, a drain connected to the output terminal 720, and a gate connected to an input terminal 710. The NMOS transistor 704 has a source connected to the reference terminal GND, and a gate connected to a drain of a PMOS transistor 706 and a drain of an NMOS transistor 707. An NMOS transistor 705 has a source connected to a source of the PMOS transistor 706, and a drain and a gate that are connected to the power supply terminal VDD. The PMOS transistor 706 has a gate connected to the input terminal 710. The NMOS transistor 707 has a source connected to the reference terminal GND, and a gate connected to the input terminal 710. Although not illustrated, the power supply terminal VDD is supplied with a High voltage of 3 V from a power source, while the reference terminal GND is supplied with a Low voltage of 0 V from the power source.

Subsequently, an operation of the conventional CMOS input buffer circuit is described. In this CMOS input buffer circuit, the PMOS transistors each have a threshold voltage of −0.5 V while the NMOS transistors each have a threshold voltage of 0.5 V.

First, if a Low voltage of 0 V is input to the input terminal 710, the NMOS transistor 703 and the NMOS transistor 707 are turned OFF while the PMOS transistor 706 is turned ON. The gate of the NMOS transistor 704 is supplied with 2.5 V, which is a voltage determined by subtracting the threshold voltage of the NMOS transistor 705 from 3 V. Accordingly, the NMOS transistor 704 is turned ON. Then, the gate of the PMOS transistor 701 becomes 0 V to turn ON the PMOS transistor 701. Consequently, the output terminal 720 outputs 3 V. The PMOS transistor 702 is turned OFF because the gate of the PMOS transistor 702 is 3 V. That is, if 0 V is input to the input terminal 710, the output terminal 720 outputs 3 V, which is a High voltage in terms of CMOS level. On the other hand, if 3 V is input to the input terminal 710, the output terminal 720 outputs 0 V, which is a Low voltage in terms of CMOS level.

In those cases, one MOS transistor is always turned OFF in each of three current paths, and hence the CMOS input buffer circuit consumes no current.

Next, if a voltage lower than CMOS level and equal to or higher than such a voltage as to allow the NMOS transistors to be turned ON is input to the input terminal 710, the NMOS transistor 703 is turned ON and accordingly the output terminal 720 becomes 0 V. Because the output terminal 720 is 0 V, the PMOS transistor 702 is turned ON. The NMOS transistor 707 is turned ON, and hence the gate of the NMOS transistor 704 becomes 0 V to turn OFF the NMOS transistor 704. Then, the gate of the PMOS transistor 701 becomes 3 V to turn OFF the PMOS transistor 701. That is, if a voltage lower than CMOS level and equal to or higher than such a voltage as to allow the NMOS transistors to be turned ON is input to the input terminal 710, the output terminal 720 outputs 0 V, which is a Low voltage in terms of CMOS level. However, because the source of the PMOS transistor 706 is 2.5 V, which is determined by subtracting the threshold voltage of 0.5 V of the NMOS transistor 705 from the voltage of 3 V of the power supply terminal VDD, the PMOS transistor 706 cannot be turned OFF until the gate of the PMOS transistor 706 is supplied with a voltage of 2 V or higher. Consequently, a current flows via the PMOS transistor 706 and the NMOS transistor 707, resulting in current consumption.

In this case, in order to prevent current consumption with an even lower input voltage, the source voltage of the PMOS transistor 706 needs to be lowered by, for example, a configuration in which two NMOS transistors 705 are connected in series (see, for example, Japanese Patent Application Laid-open No. 2000-13214 (FIG. 3)).

However, the conventional CMOS input buffer circuit has a minimum operating voltage that is defined by higher one of a total voltage of the threshold voltage of the NMOS transistor 705 and the threshold voltage of the NMOS transistor 704 and a total voltage of the threshold voltage of the NMOS transistor 705 and an absolute value of the threshold voltage of the PMOS transistor 706. For that reason, setting the source voltage of the PMOS transistor 706 to be low for the purpose of preventing current consumption poses a problem that a high minimum operating voltage is required.

Meanwhile, there has been devised a method in which a reference voltage circuit for outputting a reference voltage is added to the configuration of FIG. 7 such that an output of the reference voltage circuit is connected to the gate of the NMOS transistor 705. This configuration may eliminate a fear of the PMOS transistor 706 being turned ON when a voltage lower than CMOS level is input with a high power supply voltage. However, there is another problem that the added reference voltage circuit consumes a current.

SUMMARY OF THE INVENTION

The present invention has been made in view of the above-mentioned problems, and it is an object thereof to provide a complementary metal oxide semiconductor (CMOS) input buffer circuit that is capable of lower voltage operation with lower current consumption. In other words, it is an object of the present invention to provide a CMOS input buffer circuit that consumes no current when a High voltage lower than CMOS level is input to an input terminal with an even higher power supply voltage.

In order to solve the conventional problems, a CMOS input buffer circuit according to the present invention has the following configuration.

The CMOS input buffer circuit converts a signal lower than CMOS level that is input to an input terminal into a CMOS level signal, and outputs the converted CMOS level signal to an output terminal, the CMOS input buffer circuit including: a power supply terminal (VDD) and a reference terminal (GND) that are each supplied with a CMOS level voltage; a depletion type NMOS transistor including a drain connected to the power supply terminal (VDD), and a gate connected to the output terminal; a PMOS transistor including a source connected to a source of the depletion type NMOS transistor, a drain connected to the output terminal, and a gate connected to the input terminal; and an NMOS transistor including a source connected to the reference terminal (GND), a gate connected to the input terminal, and a drain connected to the output terminal.

The CMOS input buffer circuit according to the present invention has a minimum operating voltage that is defined by higher one of an absolute value of a threshold voltage of the PMOS transistor and a threshold voltage of the NMOS transistor, resulting in a lower minimum operating voltage.

Besides, the present invention produces an effect that the CMOS input buffer circuit consumes no current no matter how much the power supply voltage increases, as long as the CMOS input buffer circuit is supplied with a High voltage that is equal to or higher than a voltage determined by subtracting the absolute value of the threshold voltage of the PMOS transistor from an absolute value of a threshold voltage of the depletion type NMOS (DNMOS) transistor.

DETAILED DESCRIPTION OF THE PREFERRED EMBODIMENTS

Now, referring to the accompanying drawings, embodiments of the present invention are described below.

First Embodiment

Figure 1:
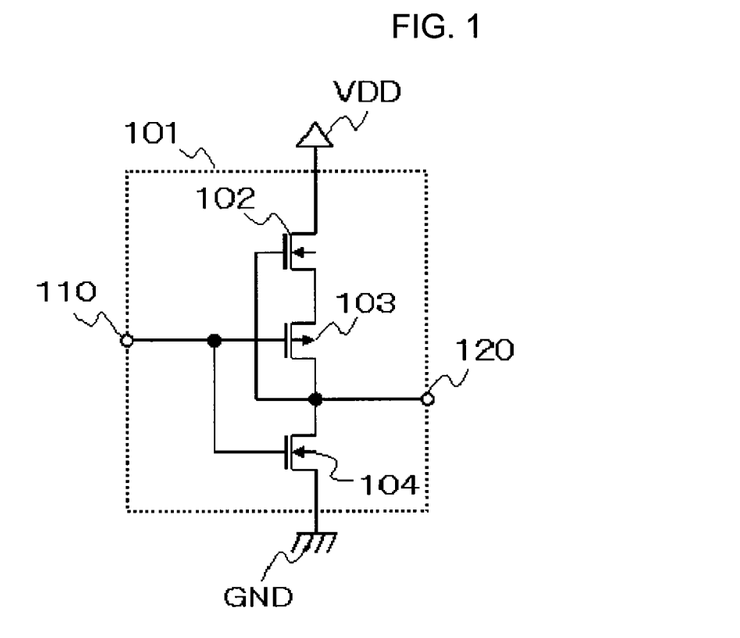
FIG. 1 is a circuit diagram illustrating a complementary metal oxide semiconductor (CMOS) input buffer circuit according to a first embodiment of the present invention.

FIG. 1 is a circuit diagram illustrating a complementary metal oxide semiconductor (CMOS) input buffer circuit according to a first embodiment of the present invention. A CMOS input buffer circuit 101 according to the first embodiment includes a depletion type NMOS transistor (hereinafter, abbreviated as DNMOS transistor) 102, a PMOS transistor 103, and an NMOS transistor 104.

The DNMOS transistor 102 has a drain connected to a power supply terminal VDD, a source connected to a source of the PMOS transistor 103, and a gate connected to an output terminal 120. The PMOS transistor 103 has a drain connected to the output terminal 120, and a gate connected to an input terminal 110. The NMOS transistor 104 has a source connected to a reference terminal GND, a drain connected to the output terminal 120, and a gate connected to the input terminal 110. Although not illustrated, the power supply terminal VDD is supplied with a High voltage of 3 V from a power source, while the reference terminal GND is supplied with a Low voltage of 0 V from the power source. Note that, the DNMOS transistor 102 is designed to have an absolute value of its threshold voltage larger than an absolute value of a threshold voltage of the PMOS transistor 103.

Subsequently, an operation of the CMOS input buffer circuit according to the first embodiment is described.

If a voltage equal to or higher than a threshold voltage of the NMOS transistor 104 is input to the input terminal 110, the NMOS transistor 104 is turned ON, and then the output terminal 120 and the gate of the DNMOS transistor 102 become 0 V. Accordingly, if the absolute value of the threshold voltage of the DNMOS transistor 102 is smaller than a voltage determined by adding the absolute value of the threshold voltage of the PMOS transistor 103 to the voltage of the input terminal 110, the DNMOS transistor 102 and the PMOS transistor 103 are turned OFF. Consequently, the voltage of the output terminal 120 becomes 0 V. Further, no current flows from the power supply terminal VDD into the reference terminal GND.

If 0 V is input to the input terminal 110, the absolute value of the threshold voltage of the DNMOS transistor 102 is larger than a voltage determined by adding the absolute value of the threshold voltage of the PMOS transistor 103 to the voltage of the input terminal 110, and hence the DNMOS transistor 102 and the PMOS transistor 103 are turned ON. Consequently, the voltage of the output terminal 120 equals the voltage of the power supply terminal VDD. Further, because the NMOS transistor 104 is turned OFF, no current flows from the power supply terminal VDD into the reference terminal GND.

In other words, the above-mentioned CMOS input buffer circuit according to the first embodiment illustrated in FIG. 1 consumes no current no matter how much the power supply voltage increases, as long as the CMOS input buffer circuit is supplied with a High voltage that is equal to or higher than a voltage determined by subtracting the absolute value of the threshold voltage of the PMOS transistor 103 from the absolute value of the threshold voltage of the DNMOS transistor 102.

In addition, owing to the above-mentioned configuration, the CMOS input buffer circuit has a minimum operating voltage that is defined by higher one of the absolute value of the threshold voltage of the PMOS transistor 103 and the threshold voltage of the NMOS transistor 104. Therefore, the CMOS input buffer circuit may operate with a low power supply voltage compared to a conventional CMOS input buffer circuit.

As described above, the CMOS input buffer circuit according to the first embodiment illustrated in FIG. 1 may solve all the problems inherent in the conventional CMOS input buffer circuit.

It should be understood that, while the DNMOS transistor 102 is configured such that the gate thereof is connected to the output terminal 120, the same function can be obtained when the gate of the DNMOS transistor 102 is connected to a node whose voltage approximates the voltage of the reference terminal GND when a High voltage is input to the input terminal 110 while approximating the voltage of the power supply terminal VDD when a Low voltage is input thereto.

Second Embodiment

Figure 2:
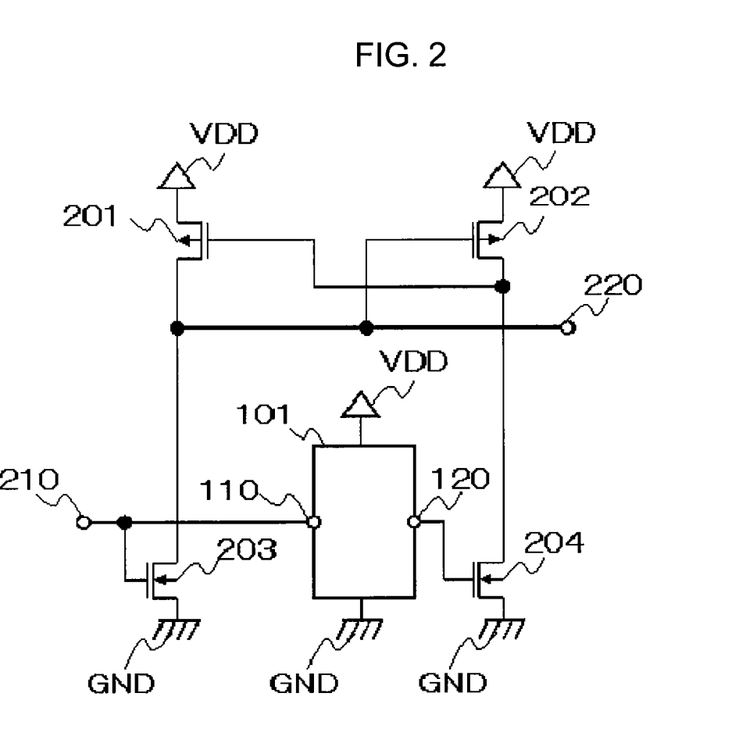
FIG. 2 is a circuit diagram illustrating a CMOS input buffer circuit according to a second embodiment of the present invention.

FIG. 2 is a circuit diagram illustrating a CMOS input buffer circuit according to a second embodiment of the present invention. The CMOS input buffer circuit according to the second embodiment has a configuration obtained by adding to the CMOS input buffer circuit 101 of the first embodiment a level shift circuit that includes a PMOS transistor 201, a PMOS transistor 202, an NMOS transistor 203, and an NMOS transistor 204.

The PMOS transistor 201 has a source connected to the power supply terminal VDD, a drain connected to an output terminal 220, and a gate connected to respective drains of the PMOS transistor 202 and the NMOS transistor 204. The PMOS transistor 202 has a source connected to the power supply terminal VDD, and a gate connected to the output terminal 220. The NMOS transistor 203 has a source connected to the reference terminal GND, a drain connected to the output terminal 220, and a gate connected to an input terminal 210. The NMOS transistor 204 has a source connected to the reference terminal GND, and a gate connected to the output terminal 120 of the CMOS input buffer circuit 101. The input terminal 110 of the CMOS input buffer circuit 101 is connected to the input terminal 210. Although not illustrated, the power supply terminal VDD is supplied with a positive voltage from a power source, while the reference terminal GND is supplied with a voltage of 0 V from the power source.

Subsequently, an operation of the CMOS input buffer circuit according to the second embodiment is described.

If 0 V is input to the input terminal 210, the NMOS transistor 203 is turned OFF, and the voltage of the output terminal 120 of the CMOS input buffer circuit 101 equals the voltage of the power supply terminal VDD to turn ON the NMOS transistor 204. Accordingly, the drain of the NMOS transistor 204 becomes 0 V to turn ON the PMOS transistor 201 so that the output terminal 220 may have a High voltage in terms of CMOS level. Then, because the output terminal 220 has a High voltage in terms of CMOS level, the PMOS transistor 202 is turned OFF. Therefore, in the case where 0 V is input to the input terminal 210, even if the voltage of the output terminal 120 of the CMOS input buffer circuit 101 is lower than a High voltage in terms of CMOS level, the output terminal 220 outputs a High voltage in terms of CMOS level. Besides, because the NMOS transistor 203 and the PMOS transistor 202 are turned OFF and the CMOS input buffer circuit 101 consumes no current as well, the entire circuit consumes no current as well.

If a High voltage lower than CMOS level is input to the input terminal 210, the NMOS transistor 203 is turned ON and accordingly the output terminal 220 becomes 0 V. The output terminal 120 of the CMOS input buffer circuit 101 becomes 0 V to turn OFF the NMOS transistor 204. Then, because the output terminal 220 is 0 V, the PMOS transistor 202 is turned ON so that the respective drains of the PMOS transistor 202 and the NMOS transistor 204 may have a High voltage in terms of CMOS level to turn OFF the PMOS transistor 201. Therefore, even if a High voltage lower than CMOS level is input to the input terminal 210, the output terminal 220 outputs a Low voltage in terms of CMOS level. Besides, because the NMOS transistor 204 and the PMOS transistor 201 are turned OFF and the CMOS input buffer circuit 101 consumes no current as well, the entire circuit consumes no current.

As described above, the CMOS input buffer circuit according to the second embodiment illustrated in FIG. 2 may solve all the problems inherent in the conventional CMOS input buffer circuit. In addition, even if the CMOS input buffer circuit 101 outputs a High voltage lower than CMOS level, the output terminal 220 may output a High voltage in terms of CMOS level without current consumption.

It should be understood that, while the DNMOS transistor 102 is configured such that the gate thereof is connected to the output terminal 120, the same function can be obtained when the gate of the DNMOS transistor 102 is connected to a node whose voltage approximates the voltage of the reference terminal GND when a High voltage is input to the input terminal 110 while approximating the voltage of the power supply terminal VDD when a Low voltage is input thereto.

Further, different power supply terminals VDD may be provided between the CMOS input buffer circuit and the level shift circuit.

Third Embodiment

Figure 3:
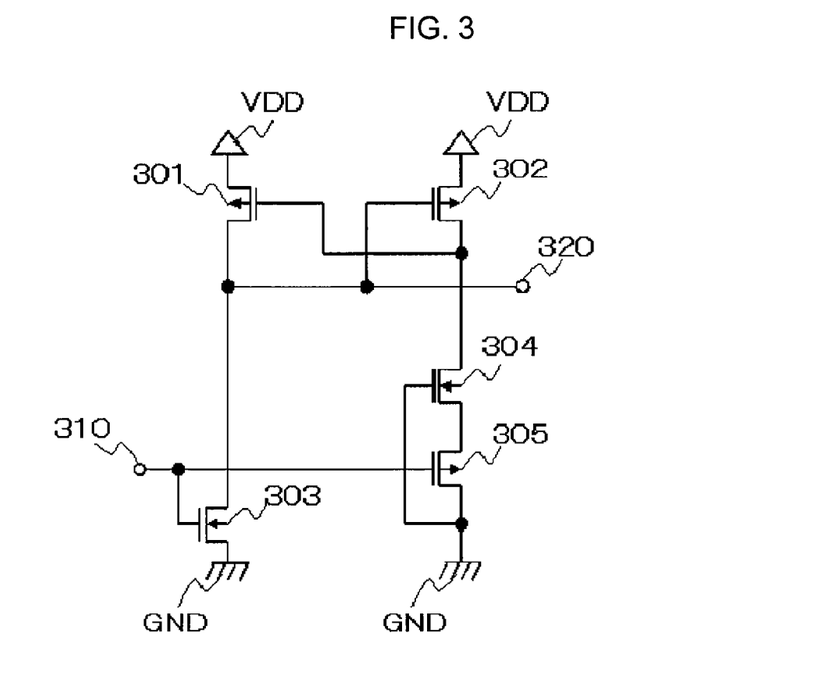
FIG. 3 is a circuit diagram illustrating a CMOS input buffer circuit according to a third embodiment of the present invention.

FIG. 3 is a circuit diagram illustrating a CMOS input buffer circuit according to a third embodiment of the present invention. The CMOS input buffer circuit according to the third embodiment includes a PMOS transistor 301, a PMOS transistor 302, an NMOS transistor 303, a DNMOS transistor 304, and a PMOS transistor 305.

The PMOS transistor 301 has a source connected to the power supply terminal VDD, a drain connected to an output terminal 320, and a gate connected to a drain of the PMOS transistor 302 and a drain of the DNMOS transistor 304. The PMOS transistor 302 has a source connected to the power supply terminal VDD, and a gate connected to the output terminal 320. The NMOS transistor 303 has a source connected to the reference terminal GND, a drain connected to the output terminal 320, and a gate connected to an input terminal 310. The DNMOS transistor 304 has a source connected to a source of the PMOS transistor 305, and a gate connected to the reference terminal GND. The PMOS transistor 305 has a drain connected to the reference terminal GND, and a gate connected to the input terminal 310. Although not illustrated, the power supply terminal VDD is supplied with a High voltage of 3 V from a power source, while the reference terminal GND is supplied with a Low voltage of 0 V from the power source. Note that, the DNMOS transistor 304 is designed to have an absolute value of its threshold voltage larger than an absolute value of a threshold voltage of the PMOS transistor 305.

Subsequently, an operation of the CMOS input buffer circuit according to the third embodiment is described.

If 0 V is input to the input terminal 310, the NMOS transistor 303 is turned OFF while the PMOS transistor 305 and the DNMOS transistor 304 are turned ON. The gate of the PMOS transistor 301 has a voltage approximate to the absolute value of the threshold voltage of the PMOS transistor 305. Accordingly, if the voltage of the power supply terminal VDD is equal to or higher than a voltage determined by adding together the absolute value of the threshold voltage of the PMOS transistor 305 and the absolute value of the threshold voltage of the PMOS transistor 301, the PMOS transistor 301 is turned ON so that the output terminal 320 may be High in terms of CMOS level. After the output terminal 320 becomes High in terms of CMOS level, the PMOS transistor 302 is turned OFF.

If a High voltage lower than CMOS level is input to the input terminal 310, the NMOS transistor 303 is turned ON while the PMOS transistor 305 and the DNMOS transistor 304 are turned OFF, and accordingly the output terminal 320 becomes 0 V. Then, because the output terminal 320 is 0 V, the PMOS transistor 302 is turned ON so that the drain of the PMOS transistor 302 may be High in terms of CMOS level. Because the drain of the PMOS transistor 302 is High in terms of CMOS level, the PMOS transistor 301 is turned OFF.

As describe above, the CMOS input buffer circuit according to the third embodiment may solve the problems inherent in the conventional CMOS input buffer circuit with a simpler circuit configuration compared to the second embodiment.

It should be understood that, while the DNMOS transistor 304 is configured such that the gate thereof is connected to the reference terminal GND, the same function can be obtained when the gate of the DNMOS transistor 304 is connected to a node whose voltage approximates the voltage of the reference terminal GND when a High voltage is input to the input terminal 310 while approximating the voltage of the power supply terminal VDD when a Low voltage is input thereto.

Fourth Embodiment

Figure 4:
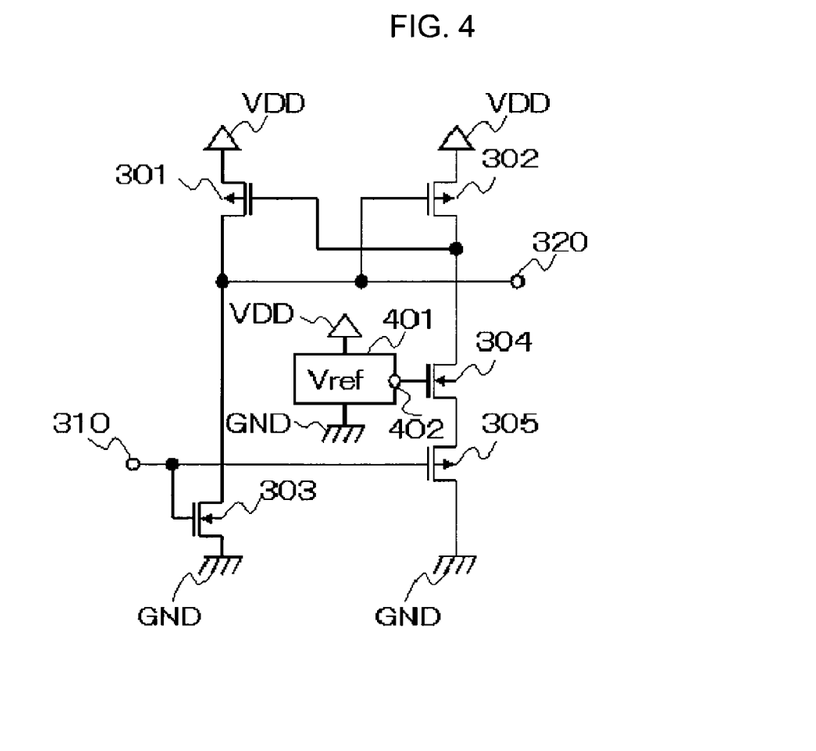
FIG. 4 is a circuit diagram illustrating a CMOS input buffer circuit according to a fourth embodiment of the present invention.

FIG. 4 is a circuit diagram illustrating a CMOS input buffer circuit according to a fourth embodiment of the present invention. The CMOS input buffer circuit according to the fourth embodiment includes, in addition to the CMOS input buffer circuit of the third embodiment, a reference voltage circuit 401 for outputting a reference voltage. Further, the gate of the DNMOS transistor 304 is connected not to the reference terminal GND but to an output terminal 402 of the reference voltage circuit 401.

With the above-mentioned configuration, the PMOS transistor 305 and the DNMOS transistor 304 are turned OFF on the condition that a voltage determined by adding together the voltage of the input terminal 310 and the absolute value of the threshold voltage of the PMOS transistor 305 is equal to or higher than a voltage determined by adding together the absolute value of the threshold voltage of the DNMOS transistor 304 and the reference voltage of the reference voltage circuit 401.

Therefore, even in a case where the absolute value of the threshold voltage of the DNMOS transistor 304 is not allowed to be set large, that is, a case where the absolute value of the threshold voltage of the PMOS transistor 305 takes a value approximate to or larger than the absolute value of the threshold voltage of the DNMOS transistor 304, the DNMOS transistor 304 and the PMOS transistor 305 may be sufficiently turned ON, to thereby solve the problems inherent in the conventional CMOS input buffer circuit.

Fifth Embodiment

Figure 5:
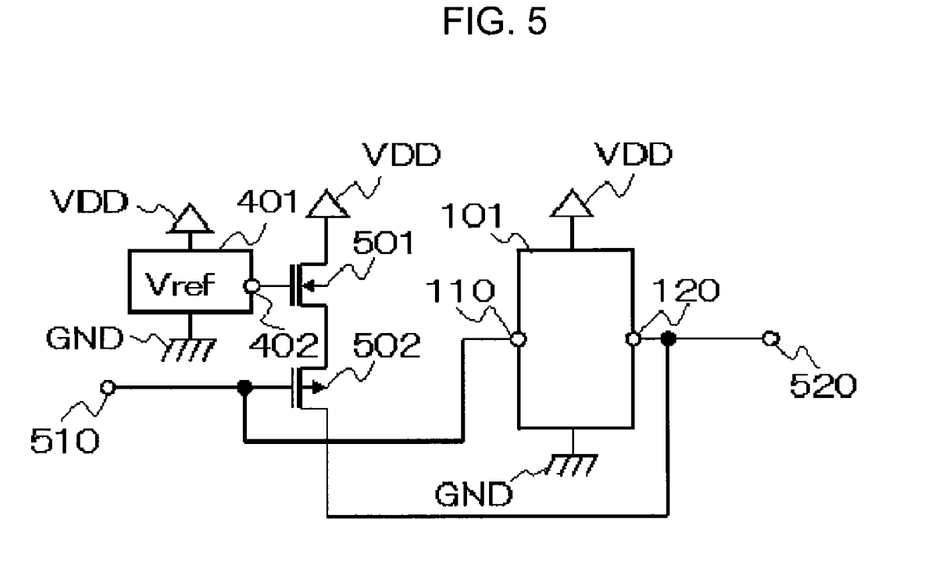
FIG. 5 is a circuit diagram illustrating a CMOS input buffer circuit according to a fifth embodiment of the present invention.

FIG. 5 is a circuit diagram illustrating a CMOS input buffer circuit according to a fifth embodiment of the present invention. The CMOS input buffer circuit according to the fifth embodiment includes the CMOS input buffer circuit 101 of the first embodiment, the reference voltage circuit 401 for outputting a reference voltage, a DNMOS transistor 501, and a PMOS transistor 502. The DNMOS transistor 501 has a source connected to a source of the PMOS transistor 502, a drain connected to the power supply terminal VDD, and a gate connected to the output terminal 402 of the reference voltage circuit 401. The PMOS transistor 502 has a drain connected to an output terminal 520, and a gate connected to an input terminal 510. The input terminal 110 and the output terminal 120 of the CMOS input buffer circuit 101 are connected to the input terminal 510 and the output terminal 520, respectively.

If 0 V is input to the input terminal 510, the DNMOS transistor 501 and the PMOS transistor 502 are turned ON. Consequently, the output terminal 520 is supplied with a voltage determined by adding an absolute value of a threshold voltage of the DNMOS transistor 501 to the reference voltage of the reference voltage circuit 401. If a High voltage lower than CMOS level is input to the input terminal 510, the DNMOS transistor 501 and the PMOS transistor 502 are turned OFF to cut off the voltage supply to the output terminal 520. Accordingly, if 0 V is input to the input terminal 510, in addition to the operation of the CMOS input buffer circuit 101 of the first embodiment, the above-mentioned voltage is supplied to the output terminal 520.

Therefore, even in a case where the absolute value of the threshold voltage of the DNMOS transistor 102 is not allowed to be set large, that is, a case where the absolute value of the threshold voltage of the PMOS transistor 103 takes a value approximate to or larger than the absolute value of the threshold voltage of the DNMOS transistor 102, the DNMOS transistor 102 and the PMOS transistor 103 may be sufficiently turned ON, to thereby solve the problems inherent in the conventional CMOS input buffer circuit. Besides, in the CMOS input buffer circuit according to the fifth embodiment, even in the case where the absolute value of the threshold voltage of the DNMOS transistor 102 is set small, a rise rate of the output voltage when 0 V is input to the input terminal 510 is dramatically improved.

Figure 6:
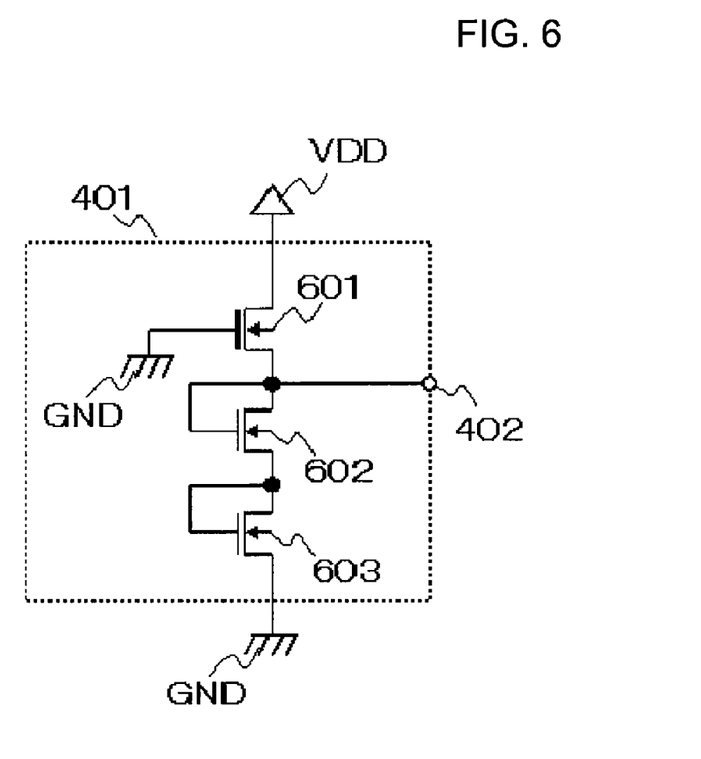
FIG. 6 is a circuit diagram illustrating an example of a reference voltage circuit used in the CMOS input buffer circuit according to the present invention.

FIG. 6 is a circuit diagram of the reference voltage circuit 401 illustrated in each of FIG. 4 and FIG. 5. The reference voltage circuit 401 includes a DNMOS transistor 601, an NMOS transistor 602, and an NMOS transistor 603. The DNMOS transistor 601 has a source connected to the output terminal 402, a drain connected to the power supply terminal VDD, and a gate connected to the reference terminal GND. The NMOS transistor 602 and the NMOS transistor 603 are each saturation-connected and are provided in series between the output terminal 402 and the reference terminal GND. Note that, the reference voltage circuit 401 is configured such that a total value of threshold voltages of the NMOS transistor 602 and the NMOS transistor 603 is larger than an absolute value of a threshold voltage of the DNMOS transistor 601.

Subsequently, an operation of the reference voltage circuit 401 illustrated in FIG. 6 is described.

The reference voltage circuit 401 is configured such that the transistors have the respective threshold voltages described above, and hence all the transistors are turned OFF so that no current may flow from the power supply terminal VDD into the reference terminal GND. On this occasion, if the voltage of the output terminal 402 falls below the absolute value of the threshold voltage of the DNMOS transistor 601, the DNMOS transistor 601 is turned ON so that a current may flow from the power supply terminal VDD into the output terminal 402. On the other hand, if the voltage of the output terminal 402 exceeds the total voltage of the threshold voltages of the NMOS transistor 602 and the NMOS transistor 603, a current flows from the output terminal 402 into the reference terminal GND. Therefore, the voltage of the output terminal 402 falls within a range that is equal to or higher than the absolute value of the threshold voltage of the DNMOS transistor 601 and equal to or lower than the total value of the threshold voltages of the NMOS transistor 602 and the NMOS transistor 603.

As described above, the reference voltage circuit 401 has the features that the accuracy of the reference voltage is ensured to fall within a given range, and that absolutely no current flows from the power supply terminal VDD into the reference terminal GND. Therefore, it should be understood that the reference voltage circuit 401 may sufficiently serve its function when being incorporated into the CMOS input buffer circuit as illustrated in each of FIG. 4 and FIG. 5, and further the CMOS input buffer circuit still consumes no current.

It should be understood that, while the reference voltage circuit 401 is configured such that a necessary number of saturation-connected NMOS transistors are connected in series between the output terminal 402 and the reference terminal GND, the same function can be obtained when saturation-connected PMOS transistors are used instead of the NMOS transistors.

Further, it should be understood that the same function and effect as in the circuit of FIG. 2 can be obtained when the CMOS input buffer circuit of the second embodiment is configured such that the output terminal 402 of the reference voltage circuit 401 of FIG. 6 is connected to the gate of the DNMOS transistor 102.

Still further, it should be understood that the same effect can also be obtained when each of the CMOS input buffer circuits described in the embodiments has a circuit configuration in which channel types of the respective MOS transistors are reversed, that is, a circuit configuration in which the P-channel MOS transistors are replaced by N-channel MOS transistors; the N-channel MOS transistors, P-channel MOS transistors; and the depletion type N-channel MOS transistor, a depletion type P-channel MOS transistor.

The signal lower than CMOS level, which is described in the present invention, may be any signal that is lower than CMOS level. For example, if an output of a solar cell, whose generation voltage is about 0.6 V, is input, whether or not the solar cell is generating power may be detected without current consumption. It should be understood that, in this way, the present invention is available for a voltage detection circuit for which high detection accuracy is not required.

Sixth Embodiment

Figure 8:
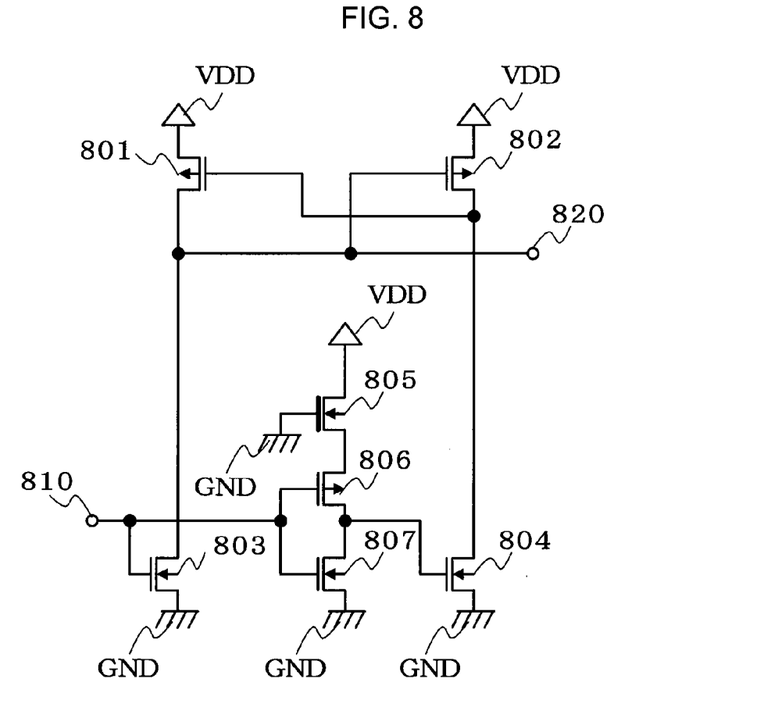
FIG. 8 is a circuit diagram illustrating a CMOS input buffer circuit according to a sixth embodiment of the present invention.

FIG. 8 is a circuit diagram illustrating a CMOS input buffer circuit according to a sixth embodiment of the present invention. The CMOS input buffer circuit according to the sixth embodiment includes an inverter circuit and a level shift circuit. The inverter circuit includes a PMOS transistor 806, a DNMOS transistor 805, and an NMOS transistor 807. The level shift circuit includes a PMOS transistor 801, a PMOS transistor 802, an NMOS transistor 803, and an NMOS transistor 804.

The PMOS transistor 801 has a source connected to the power supply terminal VDD, a drain connected to an output terminal 820, and a gate connected to respective drains of the PMOS transistor 802 and the NMOS transistor 804. The PMOS transistor 802 has a source connected to the power supply terminal VDD, and a gate connected to the output terminal 820. The NMOS transistor 803 has a source connected to the reference terminal GND, a drain connected to the output terminal 820, and a gate connected to an input terminal 810. The NMOS transistor 804 has a source connected to the reference terminal GND, and a gate connected to respective drains of the NMOS transistor 807 and the PMOS transistor 806. The NMOS transistor 807 has a source connected to the reference terminal GND, and a gate connected to a gate of the PMOS transistor 806 and the input terminal 810. The PMOS transistor 806 has a source connected to a source of the DNMOS transistor 805. The DNMOS transistor 805 has a drain connected to the power supply terminal VDD, and a gate connected to the reference terminal GND. Note that, the DNMOS transistor 805 is designed to have an absolute value of its threshold voltage larger than an absolute value of a threshold voltage of the PMOS transistor 806. Although not illustrated, the power supply terminal VDD is supplied with a positive voltage from a power source, while the reference terminal GND is supplied with a voltage of 0 V from the power source.

Subsequently, an operation of the CMOS input buffer circuit according to the sixth embodiment is described.

If 0 V is input to the input terminal 810, the absolute value of the threshold voltage of the DNMOS transistor 805 is larger than a voltage determined by adding the absolute value of the threshold voltage of the PMOS transistor 806 to the voltage of the input terminal 810, and hence the DNMOS transistor 805 and the PMOS transistor 806 are turned ON. Consequently, the voltage of the drain of the NMOS transistor 807 equals the threshold voltage of the DNMOS transistor 805. Further, because the NMOS transistor 807 is turned OFF, no current flows from the power supply terminal VDD into the reference terminal GND.

Further, if 0 V is input to the input terminal 810, the NMOS transistor 803 is turned OFF, and the voltage of the drain of the NMOS transistor 807 equals the threshold voltage of the DNMOS transistor 805 to turn ON the NMOS transistor 804. Accordingly, the drain of the NMOS transistor 804 becomes 0 V to turn ON the PMOS transistor 801 so that the output terminal 820 may have a High voltage in terms of CMOS level. Then, because the output terminal 820 has a High voltage in terms of CMOS level, the PMOS transistor 802 is turned OFF. Therefore, in the case where 0 V is input to the input terminal 810, even if the drain voltage of the NMOS transistor 807 is lower than a High voltage in terms of CMOS level, the output terminal 820 outputs a High voltage in terms of CMOS level. Besides, because the NMOS transistor 803 and the PMOS transistor 802 are turned OFF, no current flows. Therefore, the entire circuit consumes no current as well.

If a High voltage equal to or higher than a threshold voltage of the NMOS transistor 807 and lower than CMOS level is input to the input terminal 810, the NMOS transistor 807 is turned ON. The gate of the DNMOS transistor 805 is 0 V, and hence if the absolute value of the threshold voltage of the DNMOS transistor 805 is smaller than a voltage determined by adding the absolute value of the threshold voltage of the PMOS transistor 806 to the voltage of the input terminal 810, the DNMOS transistor 805 and the PMOS transistor 806 are turned OFF. Consequently, the drain of the NMOS transistor 807 becomes 0 V. Further, no current flows from the power supply terminal VDD into the reference terminal GND.

Further, if a High voltage equal to or higher than the threshold voltage of the NMOS transistor 807 and lower than CMOS level is input to the input terminal 810, the NMOS transistor 803 is turned ON and accordingly the output terminal 820 becomes 0 V. The drain of the NMOS transistor 807 becomes 0 V to turn OFF the NMOS transistor 804. Then, because the output terminal 820 is 0 V, the PMOS transistor 802 is turned ON so that the respective drains of the PMOS transistor 802 and the NMOS transistor 804 may have a High voltage in terms of CMOS level to turn OFF the PMOS transistor 801. Therefore, even if a High voltage equal to or higher than the threshold voltage of the NMOS transistor 807 and lower than CMOS level is input to the input terminal 810, the output terminal 820 outputs a Low voltage in terms of CMOS level. Besides, because the NMOS transistor 804 and the PMOS transistor 801 are turned OFF, no current flows. Therefore, the entire circuit consumes no current as well.

In other words, the above-mentioned CMOS input buffer circuit according to the sixth embodiment illustrated in FIG. 8 consumes no current no matter how much the power supply voltage increases, as long as the CMOS input buffer circuit is supplied with a High voltage that is equal to or higher than a voltage determined by subtracting the absolute value of the threshold voltage of the PMOS transistor 806 from the absolute value of the threshold voltage of the DNMOS transistor 805.

In addition, owing to the above-mentioned configuration, the CMOS input buffer circuit has a minimum operating voltage that is defined by higher one of the absolute value of the threshold voltage of the PMOS transistor 806 and the threshold voltage of the NMOS transistor 807. Therefore, the CMOS input buffer circuit may operate with a lower power supply voltage compared to the conventional CMOS input buffer circuit.

As described above, the CMOS input buffer circuit according to the sixth embodiment illustrated in FIG. 8 may solve all the problems inherent in the conventional CMOS input buffer circuit. In addition, even if the drain of the NMOS transistor 807 outputs a High voltage lower than CMOS level, the output terminal 820 may output a High voltage in terms of CMOS level without current consumption.

Note that, different power supply terminals VDD may be provided between the drain of the DNMOS transistor 805 and the sources of the PMOS transistor 801 and the PMOS transistor 802.

Seventh Embodiment

Figure 9:
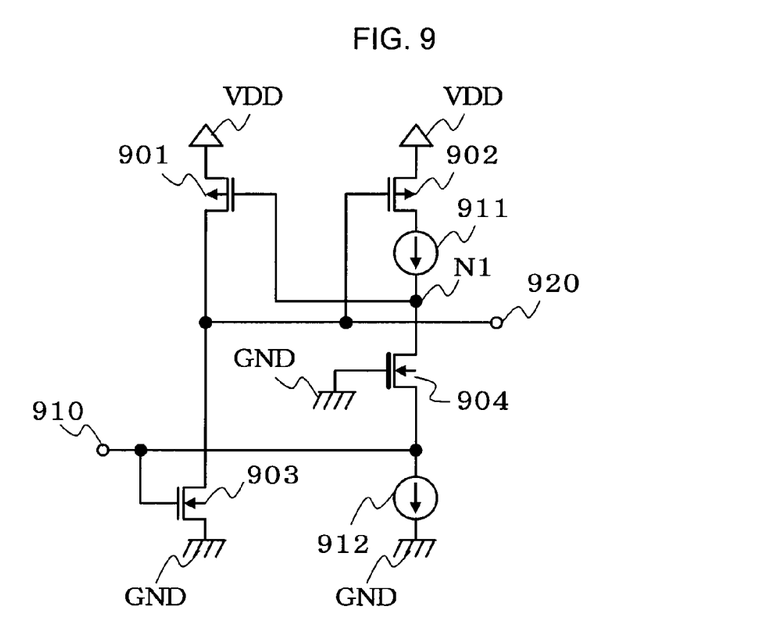
FIG. 9 is a circuit diagram illustrating a CMOS input buffer circuit according to a seventh embodiment of the present invention.

FIG. 9 is a circuit diagram illustrating a CMOS input buffer circuit according to a seventh embodiment of the present invention. The CMOS input buffer circuit according to the seventh embodiment includes a PMOS transistor 901, a PMOS transistor 902, an NMOS transistor 903, a DNMOS transistor 904, a constant current circuit 911, and a constant current circuit 912. Although not illustrated, the constant current circuit 911 is provided with a current inflow terminal, into which a constant current flows, and a current outflow terminal, from which the constant current flows. Further, the constant current circuit 911 includes a depletion type transistor whose gate and source are connected to each other such that a drain thereof corresponds to the current inflow terminal while the source or the gate thereof corresponds to the current outflow terminal. Although not illustrated, the constant current circuit 912 is provided with a current inflow terminal, into which a constant current flows, and a current outflow terminal, from which the constant current flows. Further, the constant current circuit 912 includes a depletion type transistor whose gate and source are connected to each other such that a drain thereof corresponds to the current inflow terminal while the source or the gate thereof corresponds to the current outflow terminal.

The PMOS transistor 901 has a source connected to the power supply terminal VDD, a drain connected to an output terminal 920, and a gate connected to the current outflow terminal of the constant current circuit 911 and a drain of the DNMOS transistor 904. The PMOS transistor 902 has a source connected to the power supply terminal VDD, a drain connected to the current inflow terminal of the constant current circuit 911, and a gate connected to the output terminal 920. The NMOS transistor 903 has a source connected to the reference terminal GND, a drain connected to the output terminal 920, and a gate connected to an input terminal 910. The DNMOS transistor 904 has a source connected to the input terminal 910 and the current inflow terminal of the constant current circuit 912, and a gate connected to the reference terminal GND. The current inflow terminal of the constant current circuit 912 is connected to the source of the DNMOS transistor 904 and the input terminal 910, and the current outflow terminal thereof is connected to the reference terminal GND. Although not illustrated, the power supply terminal VDD is supplied with a High voltage of 3 V from a power source, while the reference terminal GND is supplied with a Low voltage of 0 V from the power source.

Subsequently, an operation of the CMOS input buffer circuit according to the seventh embodiment is described.

The constant current circuit 911 allows a smaller amount of current to flow therethrough compared to an amount of current flowing through the constant current circuit 912.

If 0 V is input to the input terminal 910, the NMOS transistor 903 is turned OFF while the DNMOS transistor 904 is turned ON. Then, the voltage of the gate of the PMOS transistor 901 approximates the voltage of the reference terminal GND to turn ON the PMOS transistor 901, and accordingly the output terminal 920 becomes High in terms of CMOS level. After the output terminal 920 becomes High in terms of CMOS level, the PMOS transistor 902 is turned OFF.

If a High voltage lower than CMOS level is input to the input terminal 910, the NMOS transistor 903 is turned ON while the DNMOS transistor 904 is turned OFF, and accordingly the output terminal 920 becomes 0 V. Then, because the output terminal 920 is 0 V, the PMOS transistor 902 is turned ON and the drain of the PMOS transistor 902 becomes High in terms of CMOS level. Further, because the drain of the PMOS transistor 902 is High in terms of CMOS level, the current outflow terminal of the constant current circuit 911 becomes High to turn OFF the PMOS transistor 901.

In a no-load state where nothing is input to the input terminal 910, the voltage of the input terminal 910 approximates the voltage of the reference terminal GND so as to allow a larger amount of current to flow through the constant current circuit 912 compared to the constant current circuit 911. Then, the NMOS transistor 903 is turned OFF while the DNMOS transistor 904 is turned ON. Further, the voltage of the gate of the PMOS transistor 901 approximates the voltage of the reference terminal GND to turn ON the PMOS transistor 901, and accordingly the output terminal 920 becomes High in terms of CMOS level. After the output terminal 920 becomes High in terms of CMOS level, the PMOS transistor 902 is turned OFF.

As described above, the CMOS input buffer circuit according to the seventh embodiment may solve the problems inherent in the conventional CMOS input buffer circuit without being unstable even when the input terminal is in a no-load state.

It should be understood that, while the DNMOS transistor 904 is configured such that the gate thereof is connected to the reference terminal GND, the same function can be obtained when the gate of the DNMOS transistor 904 is connected to a node whose voltage approximates the voltage of the reference terminal GND when a High voltage is input to the input terminal 910 while approximating the voltage of the power supply terminal VDD when a Low voltage is input thereto.

What is claimed is:

1. A complementary metal oxide semiconductor (CMOS) input buffer circuit for converting a signal lower than CMOS level that is input to an input terminal into a CMOS level signal and outputting the converted CMOS level signal to an output terminal, the CMOS input buffer circuit comprising:
a power supply terminal (VDD) and a reference terminal (GND) that are each supplied with a CMOS level voltage;
a first depletion type NMOS transistor including:
a drain connected to the power supply terminal (VDD); and
a gate connected to the output terminal;
a first PMOS transistor including:
a source connected to a source of the first depletion type NMOS transistor;
a drain connected to the output terminal; and
a gate connected to the input terminal; and
an NMOS transistor including:
a source connected to the reference terminal (GND);
a gate connected to the input terminal; and
a drain connected to the output terminal
a reference voltage circuit for outputting a reference voltage from a reference voltage output terminal thereof;
a second PMOS transistor including:
a drain connected to the output terminal; and
a gate connected to the input terminal; and
a second depletion type NMOS transistor including:
a drain connected to the power supply terminal (VDD);
a source connected to a source of the second PMOS transistor; and
a gate connected to the reference voltage output terminal.

2. A CMOS input buffer circuit according to claim 1, further comprising a level shift circuit that is connected between the input terminal and the output terminal of the CMOS input buffer circuit.

3. A CMOS input buffer circuit according to claim 1, wherein the reference voltage circuit comprises:
a third depletion type NMOS transistor including:
a drain connected to the power supply terminal (VDD);
a gate connected to the reference terminal (GND); and
a source connected to the reference voltage output terminal; and
at least one saturation-connected MOS transistor that is connected between the reference voltage output terminal and the reference terminal (GND).

4. A CMOS input buffer circuit for converting a signal lower than CMOS level that is input to an input terminal into a CMOS level signal and outputting the converted CMOS level signal to an output terminal, the CMOS input buffer circuit comprising:
a power supply terminal (VDD) and a reference terminal (GND) that are each supplied with a CMOS level voltage;
an NMOS transistor including:
a source connected to the reference terminal (GND);
a gate connected to the input terminal; and
a drain connected to the output terminal;
a first PMOS transistor including:
a source connected to the power supply terminal (VDD); and
a drain connected to the output terminal;
a second PMOS transistor including:
a source connected to the power supply terminal (VDD);
a drain connected to a gate of the first PMOS transistor; and
a gate connected to the output terminal;
a third PMOS transistor including:
a drain connected to the reference terminal (GND); and
a gate connected to the input terminal; and
a first depletion type NMOS transistor including:
a source connected to a source of the third PMOS transistor;
a drain connected to the drain of the second PMOS transistor; and
a gate connected to a reference voltage.

5. A CMOS input buffer circuit according to claim 4, further comprising a circuit for outputting the reference voltage,
the circuit comprising:
a second depletion type NMOS transistor including:
a drain connected to the power supply terminal (VDD);
a gate connected to the reference terminal (GND); and
a source connected to a reference voltage output terminal of the circuit; and
at least one saturation-connected MOS transistor that is connected between the reference voltage output terminal and the reference terminal (GND).

6. A CMOS input buffer circuit according to claim 4, wherein the reference voltage comprises a voltage of the reference terminal (GND).

7. A CMOS input buffer circuit for converting a signal lower than CMOS level that is input to an input terminal into a CMOS level signal and outputting the converted CMOS level signal to an output terminal, the CMOS input buffer circuit comprising:
a power supply terminal (VDD) and a reference terminal (GND) that are each supplied with a CMOS level voltage;
an NMOS transistor including:
a source connected to the reference terminal (GND);
a gate connected to the input terminal; and
a drain connected to the output terminal;
a first PMOS transistor including:
a source connected to the power supply terminal (VDD); and
a drain connected to the output terminal;
a second PMOS transistor including:
a source connected to the power supply terminal (VDD); and
a gate connected to the drain of the NMOS transistor;
a first constant current circuit including:
one terminal connected to a gate of the first PMOS transistor; and
another terminal connected to a drain of the second PMOS transistor;
a second constant current circuit including:
one terminal connected to the input terminal; and
another terminal connected to the reference terminal (GND); and
a depletion type NMOS transistor including:
a source connected to the one terminal of the second constant current circuit;
a drain connected to the gate of the first PMOS transistor; and
a gate connected to the reference terminal (GND).

* * * * *